United States Patent [19]

Cargill

[11] Patent Number: 5,668,468
[45] Date of Patent: Sep. 16, 1997

[54] COMMON MODE STABILIZING CIRCUIT AND METHOD

[75] Inventor: Robert S. Cargill, Portland, Oreg.

[73] Assignee: Harris Corporation, Melbourne, Fla.

[21] Appl. No.: 584,366

[22] Filed: Jan. 11, 1996

[51] Int. Cl.$^6$ .................................................. G05F 3/16
[52] U.S. Cl. ........................... 323/316; 327/53; 330/257; 330/258
[58] Field of Search .................... 323/314–316; 330/258, 257; 327/53

[56] References Cited

U.S. PATENT DOCUMENTS 4,446,419  5/1984  Van De Plassche et al. .......... 323/316
4,560,921  12/1985  Yamatake ................................. 323/316

Primary Examiner—Peter S. Wong
Assistant Examiner—Shawn Riley
Attorney, Agent, or Firm—Rogers & Killeen

[57] ABSTRACT

A circuit and method for stabilizing a common mode voltage in a differential circuit provides a desired common mode voltage $V_{cm}$ to control terminals of two transistors which provide the variable resistance for setting the common mode voltage. $V_{cm}$ is sampled between load resistors $R_L$ connecting operating terminals of the two transistors and applied directly to their control terminals. A known common mode current $I_{cm}$ is accepted by each transistor, leaving a differential current $I_d$ to flow through load resistors $R_L$. The circuit and method find application in a variety of uses, including transconductance and transresistance amplifiers and automatic gain control circuits.

20 Claims, 4 Drawing Sheets

COMMON MODE STABILIZING CIRCUIT AND METHOD

BACKGROUND OF THE INVENTION

The present invention relates to circuits and methods for controlling common mode voltage, and more particularly to a circuit and method for stabilizing a common mode voltage in a differential circuit which generates an output current which is to be converted to a voltage.

As is known, a differential circuit represents a signal by the difference $v_d$ between two voltages, $v_p$ and $v_n$:

$$v_d = v_p - v_n \quad (1)$$

The voltage about which this signal varies is the common mode voltage $v_{cm}$ which may be found from:

$$v_{cm} = \frac{(v_p + v_n)}{2} \quad (2)$$

One way to bias the common mode voltage of a signal is by providing a known reference current $I_{cm}$ through a load resistors $R_L$, such as in the circuit illustrated in FIG. 1 where $I_d$ is the current related to the difference $V_d$. This method is usually adequate so long as load resistors $R_L$ can both set the load impedance and define the common mode voltage.

When the common mode voltage must be forced to a desired common mode reference voltage $V_{cm}$ a common mode feedback circuit can be used, such as illustrated in FIG. 2. In this example, MOSFETs M1 and M2 are variably resistant loads (i.e., current sinks for the reference current $I_{cm}$) which operate in conjunction with an operational amplifier control loop to stabilize the common mode voltage of the signal at $V_{cm}$. As is apparent, one of the problems with this approach is that the common mode voltage setting-loop is about as large as the circuitry in the signal path. The use of this much real estate is undesirable, and a simpler, more compact circuit which is easily adapted to a variety of uses is preferred.

Accordingly, it is an object of the present invention to provide a novel circuit and method of stabilizing a common mode voltage which is both simple and adaptable to a variety of uses thereby obviating the problems of the prior art.

It is another object of the present invention to provide a novel circuit and method of stabilizing a common mode voltage in which the desired common mode reference voltage is provided directly to the control terminals of two transistors which provide variable resistances for stabilizing the common mode voltage of the circuit's output.

It is yet another object of the present invention to provide a novel circuit and method of stabilizing a common mode voltage in a differential circuit in which a desired common mode reference voltage is sensed between two load resistors which connect input terminals of two transistors and in which the sensed voltage is provided to the control terminals of the two transistors to control operation thereof.

It is still another object of the present invention to provide a novel circuit and method of stabilizing a common mode voltage for a transconductance or transresistance amplifier input stage.

It is a further object of the present invention to provide a novel circuit and method of stabilizing a common mode voltage for an automatic gain control circuit.

It is yet a further object of the present invention to provide a novel circuit for providing a stable common mode voltage having two transistors for receiving input currents at first operating terminals, two series-connected load resistors connecting the first operating terminals of the two transistors, and a connection from between the two load resistors directly to control terminals of the two transistors, whereby the average of the output voltages from the circuit is the stable common mode voltage.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

The circuit and method of the present invention are adaptable to a variety of uses, and in some of these uses the common mode voltage is related to a reference voltage which may be a parameter of the device in which the circuit operates. For example, in a multi-stage device in which the circuit and method herein are in one stage, the following stage may be a common source differential pair. It is desirable to stabilize the common mode voltage input to the differential pair at a specific level relative to the threshold voltage $V_T$ of the input devices comprising the differential pair. Since the current source for the differential pair desirably has a low saturation voltage relative to $V_T$, setting the common mode voltage to about one and one-half times $V_T$ typically will suffice.

Figure 1:
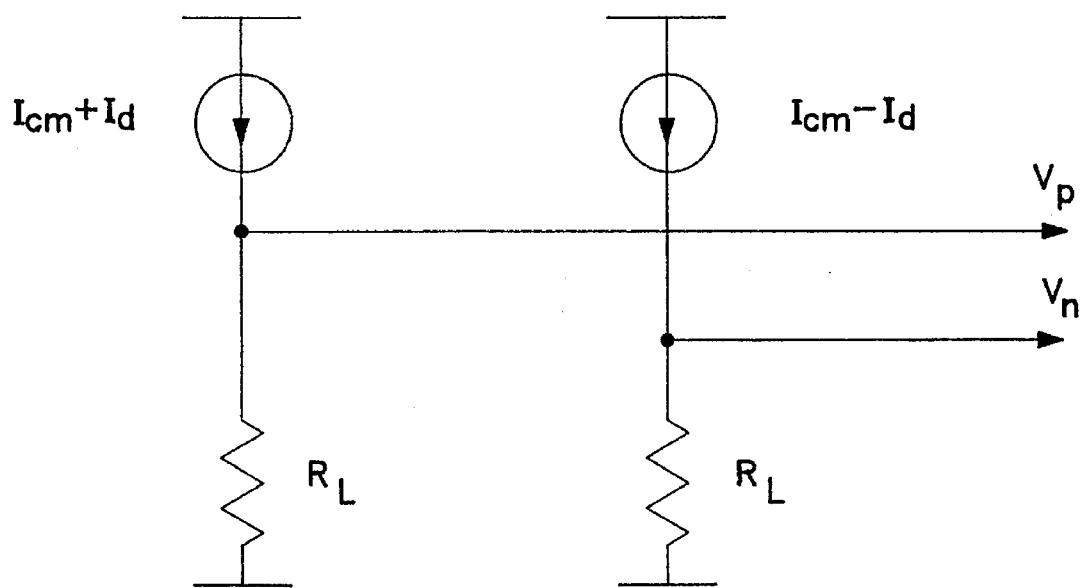
FIG. 1 is a circuit diagram illustrating a common mode voltage control circuit of the prior art.
Figure 2:
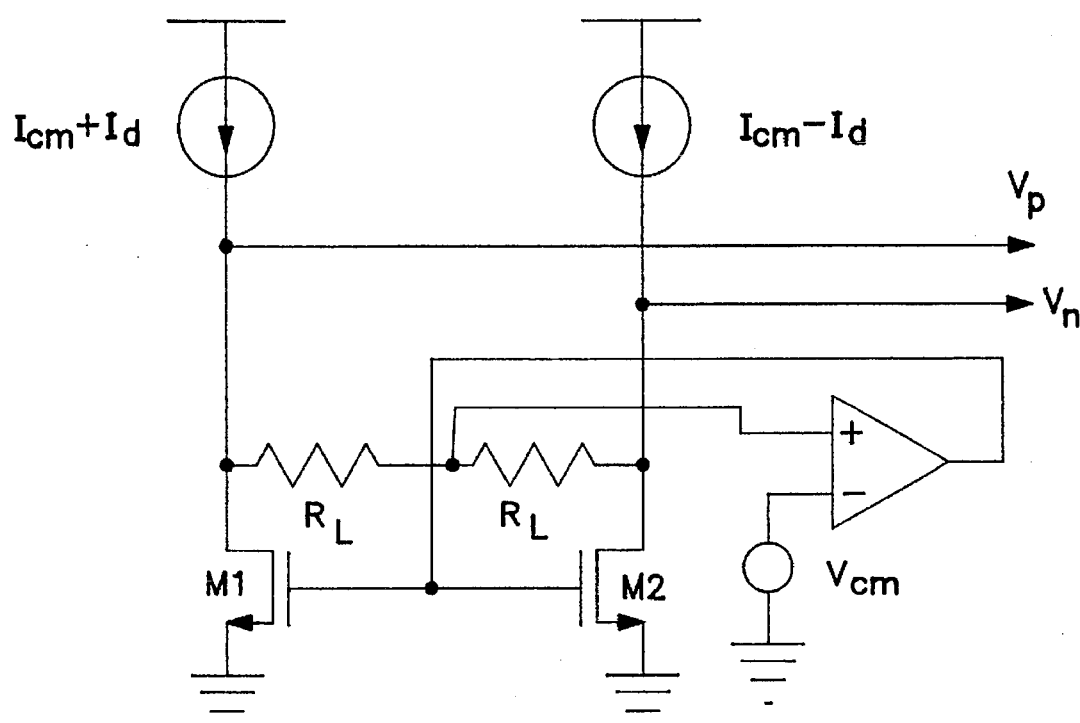
FIG. 2 is a circuit diagram illustrating a common mode voltage control circuit of the prior art which includes common mode feedback for setting the common mode voltage to a desired common mode reference voltage.
Figure 3:
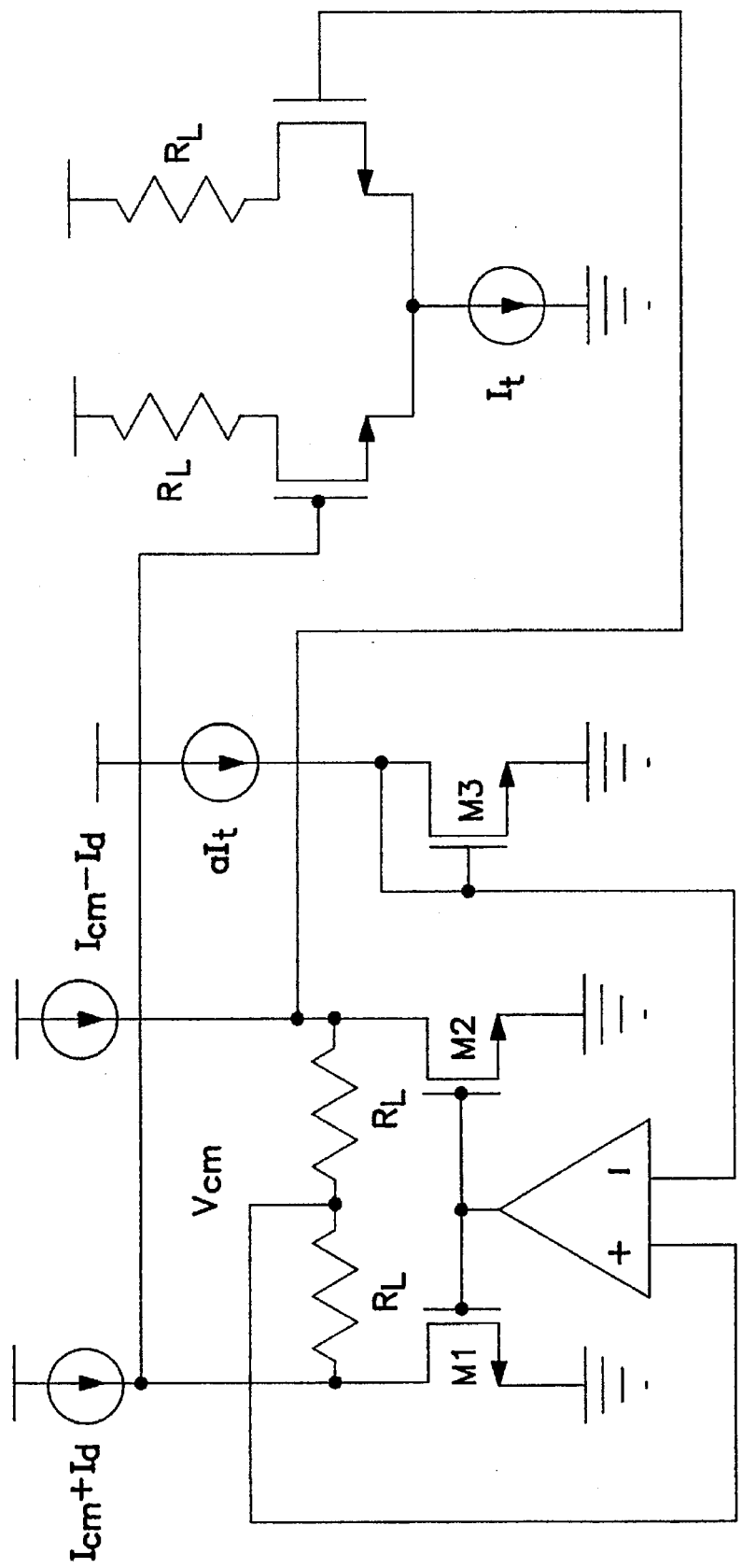
FIG. 3 is a circuit diagram illustrating a common mode voltage control circuit which includes common mode feedback for setting the common mode voltage to a desired common mode reference voltage.

The desired common mode reference voltage $V_{cm}$ at which the circuit herein is to be stabilized may be generated using the circuit of FIG. 3 in which a reference current $I_r$ is ratioed from a differential pair current source and driven into an NMOS transistor M3. However, this circuit is larger than that of the prior art and is unnecessarily cumbersome. The circuit of FIG. 3 may be reduced by eliminating the feedback loop and the MOS voltage reference and by substituting circuitry which provides the desired common mode voltage reference voltage $V_{cm}$ directly (i.e., not through an operational amplifier as in the prior art) to the control terminals of the current sink transistors M1 and M2.

Figure 4:
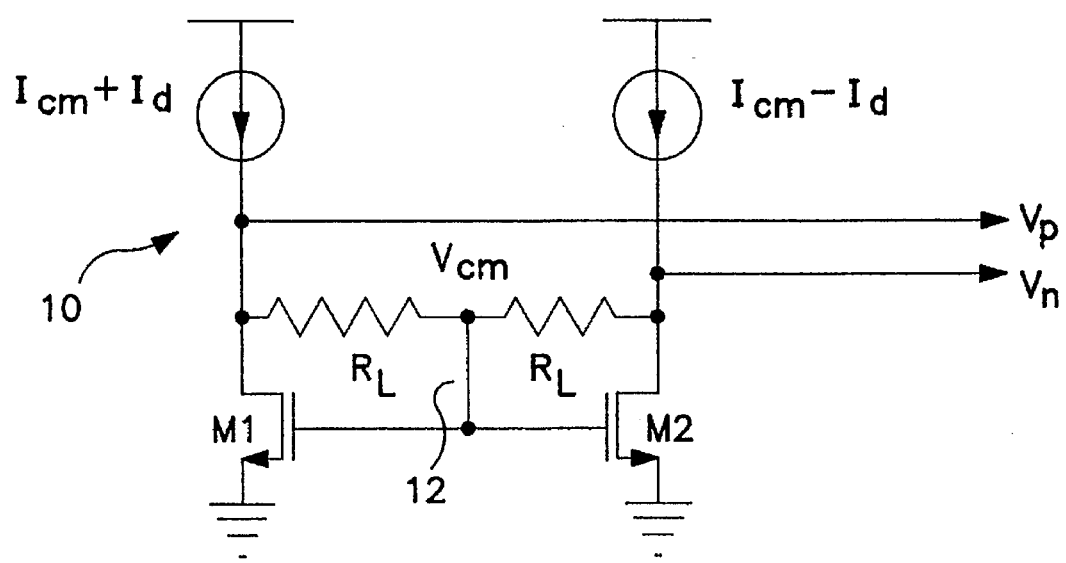
FIG. 4 is a circuit diagram illustrating a common mode voltage control circuit of the present invention which sets the common mode voltage to a desired common mode reference voltage.

With reference now to FIG. 4, an embodiment 10 of the present invention simplifies the circuit of FIG. 3 by providing the desired common mode reference voltage $V_{cm}$ directly through connection 12 to the control terminals of the two transistors which provide the variable resistance for setting the common mode voltage. $V_{cm}$ is sampled between load resistors $R_L$ and applied directly to the gates of MOSFETs M1 and M2. The gate to source voltages of M1 and M2 are identical so that the currents therethrough will also be identical if the devices have matching geometries. The known common mode current $I_{cm}$ is accepted by each transistor, leaving the differential current $I_d$ to flow through load resistors $R_L$. $V_{cm}$ may be set by selection of $I_{cm}$ and sizing of M1 and M2 by:

$$V_{cm} = \sqrt{\frac{2I_{cm}K'W}{L}} + V_T \qquad (3)$$

where W and L are the width and length of the active area of M1 and M2 (they are substantially identical), K' is a constant indicative of device transconductance which is set by transistor processing, and $V_T$ is the threshold voltage of the next stage (as in the example of the differential pair above). Thus, $V_{cm}$ may be kept within the range of acceptable common mode voltages for the next stage, and $V_{cm}$ increases in relation to the square root of $I_{cm}$.

As will be appreciated, M1 and M2 have finite output impedances, therefore the currents therethrough will vary slightly with $V_{DS}$. However, the admittance of the load resistors is usually orders of magnitude larger than that of M1 and M2 and the slight variations with $V_{DS}$ will not be a factor.

Figure 5:
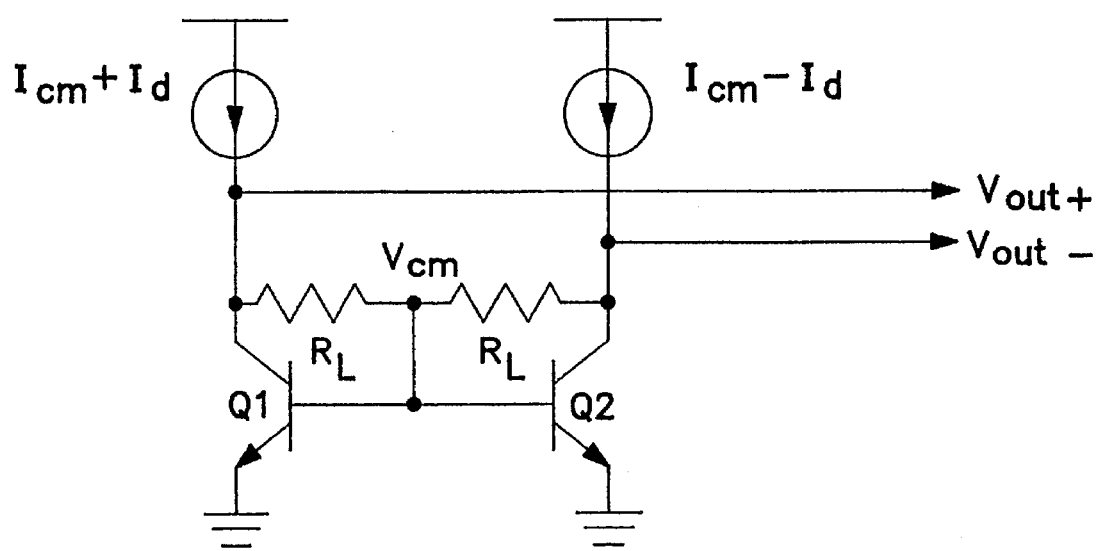
FIG. 5 is a circuit diagram illustrating a further embodiment of the common mode voltage control circuit of the present invention.

The current sink transistors M1 and M2 are shown as MOS devices, although various current source/sink devices may be substituted. For example and with reference to FIG. 5, if the stage which follows is bipolar, it would be desirable to relate the common mode voltage to the common mode voltage range of the following stage. Bipolar transistors Q1 and Q2 may be used in place of MOS devices M1 and M2 because the common mode voltage would likely be dominated by the $V_{BE}$ of the bipolar devices in the following stage. Further, in a multistage operation it may be desirable to maintain $V_{cm}$ at a predictable level. Since the node $V_{cm}$ will be clamped at 1 $V_{BE}$, the resulting common mode voltage will change only about 60 mV for a one decade change in emitter current.

Figure 6:
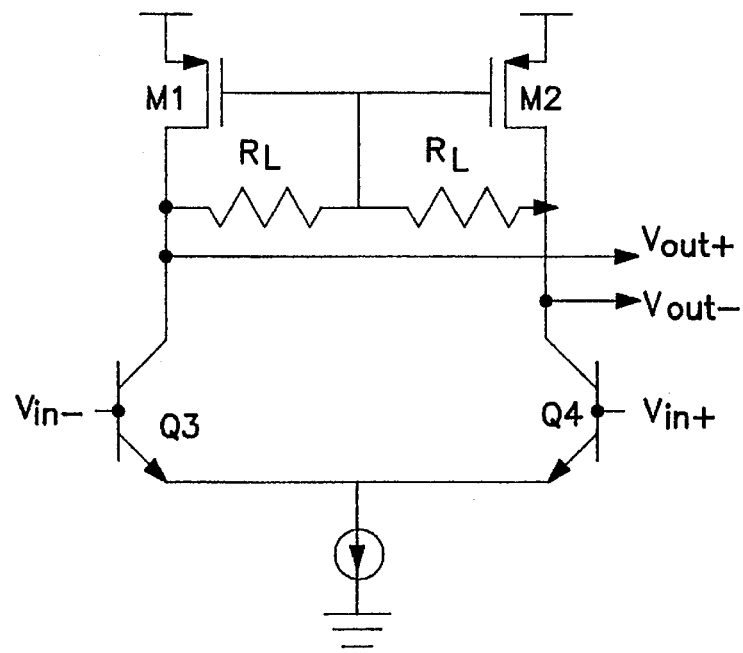
FIG. 6 is a circuit diagram illustrating a further embodiment of the present invention mated to a transconductance amplifier input stage.

The circuit and method herein may be used in differential circuits which generate an output current which is to be converted to a voltage. For example and with reference to FIG. 6, the circuit may be mated to transconductance stages to complete a voltage amplifier, or to current gain blocks to complete a transresistance amplifier. The embodiment of FIG. 6 employs PMOS devices M1 and M2 in which first operational terminals (those connected to the input currents in FIG. 4) are connected to a transconductance stage (comprising transistors Q3 and Q4), and in which the other operational terminals of M1 and M2 are connected to a predetermined voltage level.

Figure 7:
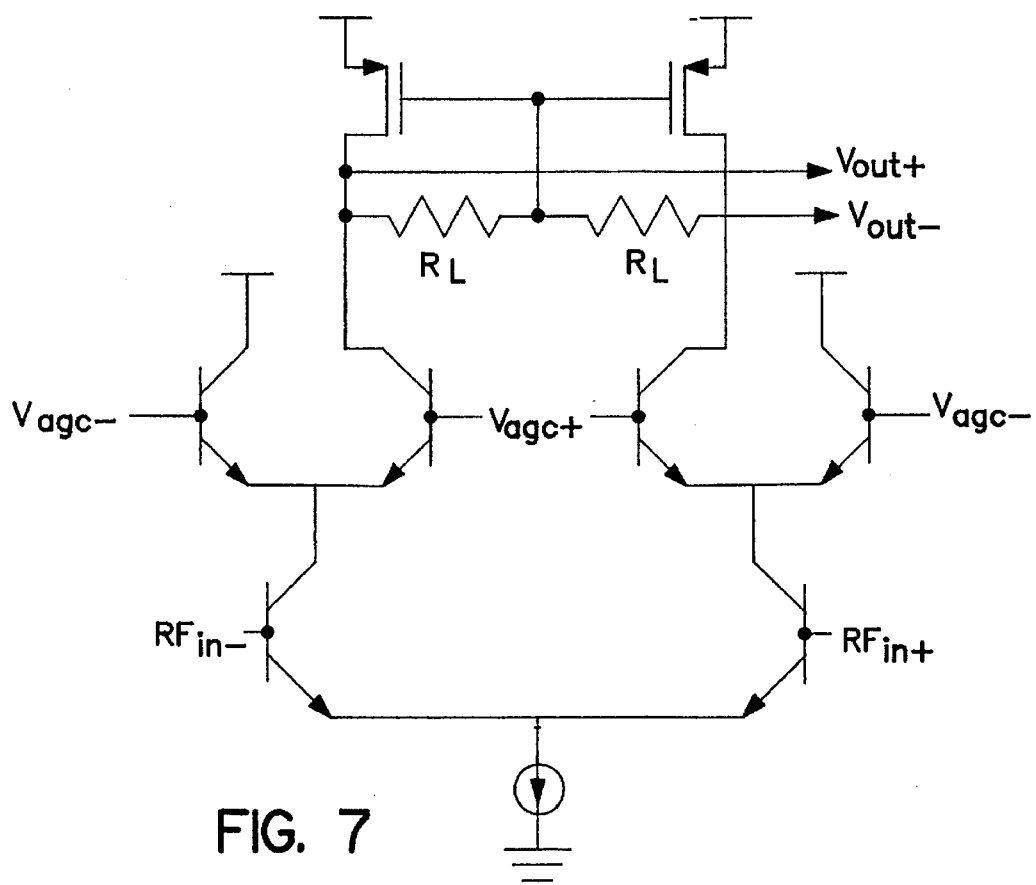
FIG. 7 is a circuit diagram illustrating a further embodiment of the present invention in an automatic gain control circuit.

In the embodiment of FIG. 7 a circuit of the present invention is part of an automatic gain control circuit in which the gain may be varied by varying the current through the load resistors. The common mode current varies directly with the voltage gain of the circuit. For example, if 20 dB of gain is desired the common mode currents will vary 10:1. Most load structures of the prior art would generate large common mode voltage shifts under these conditions, but with the present invention the shift in DC operating point will be only several millivolts.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A circuit for stabilizing a common mode voltage at a reference voltage, the circuit comprising:
   two transistors with their control terminals connected;
   two series-connected load resistors connecting first operating terminals of said two transistors, second operating terminals of said two transistors being connected to a voltage level; and
   a connection for providing the reference voltage from between said two load resistors directly to said control terminals for controlling operation of said two transistors;
   wherein each of said first operating terminals is for sensing an input current which varies from a known common mode current and for providing an output voltage which varies from a stable common mode voltage which is the reference voltage.

2. The circuit of claim 1 further comprising an amplifier input stage for providing said input currents.

3. The circuit of claim 1 wherein said two transistors are MOSFETs.

4. The circuit of claim 2 wherein said amplifier input stage comprises a pair of bipolar transistors having their bases connected to input voltages, their collectors connected to said first operating terminals, and their emitters grounded through a current source.

5. The circuit of claim 4 wherein said two transistors are P-type MOSFETs, and wherein said pair of bipolar transistors are NPN-type.

6. The circuit of claim 1 further comprising an automatic gain control circuit for providing said input currents.

7. The circuit of claim 6 wherein said automatic gain control circuit comprises two pairs of first bipolar transistors with the emitters of each of said pairs of first bipolar transistors being connected, and a pair of second bipolar transistors with the collector of each of said second bipolar transistors connected to said emitters of a different one of said pairs of first bipolar transistors.

8. The circuit of claim 7 wherein emitters of said second bipolar transistors are connected to ground through a current source.

9. The circuit of claim 8 wherein bases of said pairs of first bipolar transistors are connected to automatic gain control voltages.

10. The circuit of claim 8 wherein bases of said second bipolar transistors are connected to RF inputs.

11. A circuit with two transistors for receiving input currents at first operating terminals, the input currents including a known common mode current, the circuit for providing a stable common mode voltage and comprising:
   two series-connected load resistors connecting the first operating terminals of the two transistors; and
   a connection from between said two load resistors directly to control terminals of the two transistors,
   whereby the average of the output voltages from the first operating terminals is the stable common mode voltage.

12. The circuit of claim 11 wherein said two transistors are bipolar transistors with substantially identical base to emitter voltages.

13. The circuit of claim 11 wherein said two transistors are MOSFETs with substantially identical gate to source voltages.

14. The circuit of claim 11 wherein second operating terminals of said two transistors are grounded.

15. A method of stabilizing a common mode voltage at a reference voltage comprising the steps of:
   (a) receiving input currents at first operating terminals of two transistors, the input currents including a known common mode current;
   (b) contacting the first operating terminals of the two transistors to each other across two series-connected load resistors;
   (c) sensing a voltage between the two series-connected load resistors and providing the sensed voltage directly to control terminals of the two transistors,
   whereby the average of the output voltages from the first operating terminals is the stable common mode voltage.

16. The method of claim 15 wherein the two transistors are bipolar transistors which are provided with substantially identical base to emitter voltages.

17. The method of claim 15 wherein the two transistors are MOSFETs which are provided with substantially identical gate to source voltages.

18. The method of claim 16 further comprising the step of providing the input currents from an amplifier input stage.

19. The method of claim 17 further comprising the step of providing the input currents from an automatic gain control circuit.

20. A method of stabilizing a common mode voltage of an input signal comprising the steps of providing the desired common mode voltage directly to control terminals of two transistors which provide variable resistances for setting the common mode voltage, and providing output voltages from first operating terminals of the two transistors, the output voltages having the desired common mode voltage.

* * * * *